(12) United States Patent
Cheah et al.

(10) Patent No.: US 12,288,740 B2
(45) Date of Patent: Apr. 29, 2025

(54) SEMICONDUCTOR PACKAGE WITH HYBRID MOLD LAYERS

(71) Applicant: Intel Corporation, Santa Clara, CA (US)

(72) Inventors: Bok Eng Cheah, Gelugor (MY); Chia Chuan Wu, Butterworth (MY); Jackson Chung Peng Kong, Tanjung Tokong (MY); Kooi Chi Ooi, Bukit Gambir (MY)

(73) Assignee: Intel Corporation, Santa Clara, CA (US)

( * ) Notice: Subject to any disclaimer, the term of this patent is extended or adjusted under 35 U.S.C. 154(b) by 785 days.

(21) Appl. No.: 17/367,684

(22) Filed: Jul. 6, 2021

(65) Prior Publication Data

US 2021/0335698 A1 Oct. 28, 2021

(51) Int. Cl.
| | |
|---|---|
| *H01L 23/498* | (2006.01) |
| *H01L 21/48* | (2006.01) |
| *H01L 23/367* | (2006.01) |
| *H01L 23/552* | (2006.01) |
| *H01L 25/065* | (2023.01) |

(52) U.S. Cl.
CPC .... *H01L 23/49811* (2013.01); *H01L 21/4853* (2013.01); *H01L 23/367* (2013.01); *H01L 23/49833* (2013.01); *H01L 23/49838* (2013.01); *H01L 23/49894* (2013.01); *H01L 23/552* (2013.01); *H01L 25/0652* (2013.01)

(58) Field of Classification Search
CPC ............ H01L 23/49811; H01L 23/367; H01L 23/49833; H01L 23/49838; H01L 23/49894; H01L 23/552; H01L 25/0652; H01L 21/4853
See application file for complete search history.

(56) References Cited

U.S. PATENT DOCUMENTS

| | | | |
|---|---|---|---|
| 9,153,549 B2 * | 10/2015 | Oyamada | ................ H01L 23/60 |
| 2008/0128882 A1 * | 6/2008 | Baek | ....................... H01L 25/50 |
| | | | 438/109 |
| 2013/0001797 A1 * | 1/2013 | Choi | ..................... H01L 25/105 |
| | | | 257/774 |

\* cited by examiner

*Primary Examiner* — Peniel M Gumedzoe
(74) *Attorney, Agent, or Firm* — Viering, Jentschura & Partner mbB; Robert M Bilotta, Jr.

(57) ABSTRACT

According to various examples, a device is described. The device may include a first package substrate. The device may also include a first mold layer with a first thickness. The device may also include a second mold layer with a second thickness proximal to the first mold layer. The second thickness may be larger than the first thickness. The first mold layer may include a plurality of first interconnects coupled to the first package substrate. The second mold layer may include a plurality of second interconnects configured to couple the first package substrate to a printed circuit board.

20 Claims, 8 Drawing Sheets

SEMICONDUCTOR PACKAGE WITH HYBRID MOLD LAYERS

BACKGROUND

Conventional semiconductor packages have stacked dynamic random access memory (DRAM) coupled to semiconductor package substrates to increase DRAM bandwidth density to meet next-generation computing system requirements. An increase in the numbers of DRAM devices on the central processing unit (CPU), graphic processing unit (GPU), System-On-Chip (SOC) packages and/or printed circuit board (PCB) may lead to form-factor (i.e., footprint) expansion through additional package and/or platform real-estate requirements, which may prohibit device miniaturization.

Existing solutions to solve the above-mentioned problems include real-estate expansion to house additional DRAM memory devices for performance scaling, DRAM package form-factor miniaturization, alternative memory architecture e.g., high-bandwidth memory (HBM) with advanced packaging solution e.g., 2.5D silicon bridge interconnects for memory bandwidth scaling.

However, these existing solutions may lead to form-factor expansion i.e., bulky devices, device reliability trade-off with reduced solder joint geometry, constrained silicon interposer real-estate for memory device scaling i.e. limited to 3D stacked integrated circuit architecture, electrical and/or mechanical challenges associated with the through silicon via (TSV) interconnects e.g., high-resistance electrical path, signal crosstalk, signal return and insertion losses.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the present disclosure. The dimensions of the various features or elements may be arbitrarily expanded or reduced for clarity. In the following description, various aspects of the present disclosure are described with reference to the following drawings, in which.

DETAILED DESCRIPTION

Figure 1A:
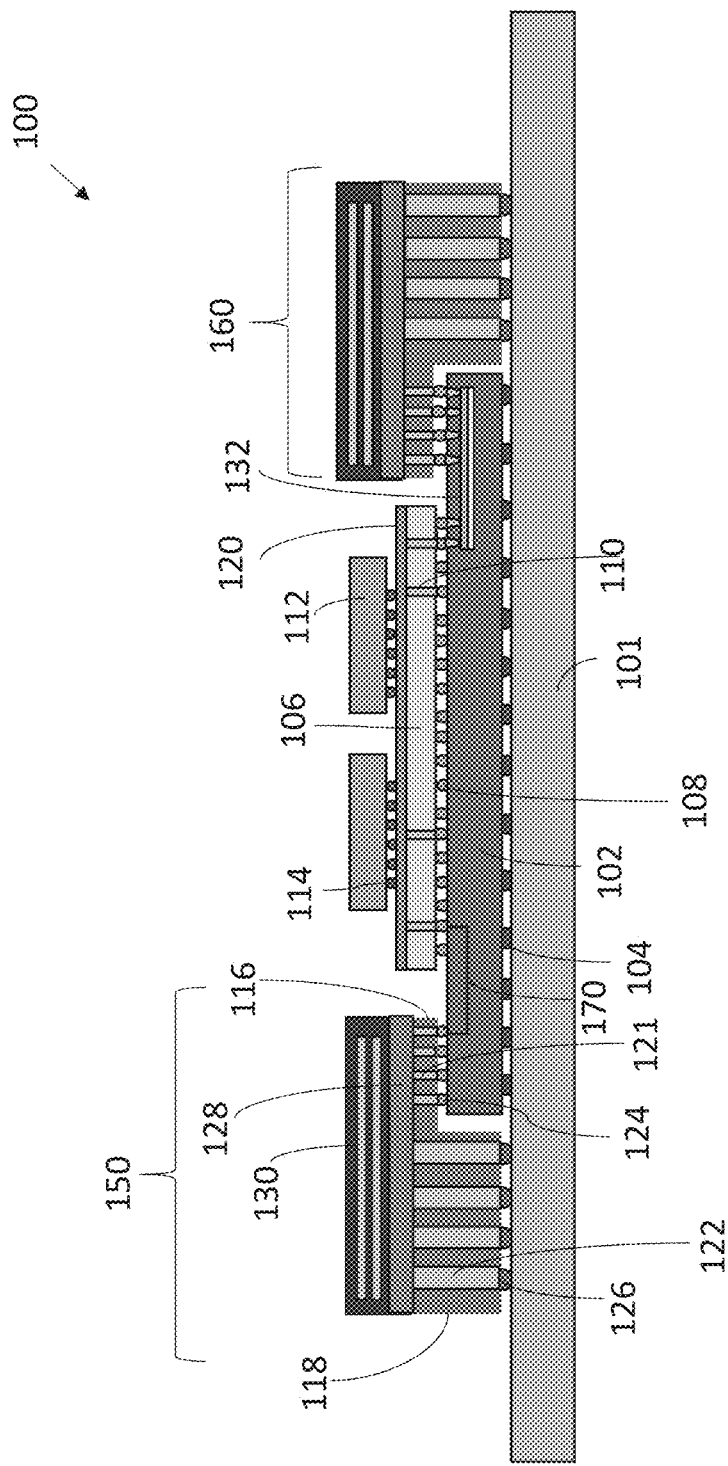
FIG. 1A shows a cross-sectional view of a semiconductor package according to an aspect of the present disclosure.

The following detailed description refers to the accompanying drawings that show, by way of illustration, specific details and aspects in which the present disclosure may be practiced. These aspects are described in sufficient detail to enable those skilled in the art to practice the present disclosure. Various aspects are provided for the present devices, and various aspects are provided for the methods. It will be understood that the basic properties of the devices also hold for the methods and vice versa. Other aspects may be utilized and structural, and logical changes may be made without departing from the scope of the present disclosure. The various aspects are not necessarily mutually exclusive, as some aspects can be combined with one or more other aspects to form new aspects.

An advantage of the present disclosure may include device form-factor miniaturization through reduction of the total package and/or printed circuit board real-estate required e.g., overlapping sections between CPU/GPU/SOC package and the DRAM memory packages An advantage of the present disclosure may include improved signal latency between CPU/GPU/SOC and DRAM memory devices through reduced channel interconnects length and/or impairments, thus allowing memory bin-speed scaling.

An advantage of the present disclosure may include improved power delivery network (PDN) and power integrity through smaller loop inductance by avoiding extensive power (Vcc) and ground (Vss) electrical paths through the CPU/GPU/SOC package substrate.

An advantage of the present disclosure may include increased device integration e.g., integration of RFIC devices adjacent to compute die(s) e.g., CPU/GPU/SOC for improved functionality and performance scaling.

These and other aforementioned advantages and features of the aspects herein disclosed will be apparent through reference to the following description and the accompanying drawings. Furthermore, it is to be understood that the features of the various aspects described herein are not mutually exclusive and can exist in various combinations and permutations.

The present disclosure generally relates to a device. The device may include a first package substrate. The device may also include a first mold layer with a first thickness. The device may also include a second mold layer with a second thickness proximal to the first mold layer. The second thickness may be larger than the first thickness. The first mold layer may include a plurality of first interconnects coupled to the first package substrate. The second mold layer may include a plurality of second interconnects configured to couple the first package substrate to a printed circuit board.

The present disclosure generally relates to a method of forming a device. The method may include providing a first package substrate. The method may include forming a first mold layer with a first thickness. The method may include forming a plurality of first interconnects of the first mold layer for coupling to the first package substrate. The method may include forming a second mold layer with a second thickness proximal to the first mold layer. The second thickness may be larger than the first thickness. The method may include forming a plurality of second interconnects of the second mold layer for coupling the first package substrate to a printed circuit board.

The present disclosure generally relates to a computing device. The computing device may include a printed circuit board. The computing device may include a device coupled to the printed circuit board. The device may include a first package substrate. The device may also include a first mold layer with a first thickness. The device may also include a second mold layer with a second thickness proximal to the first mold layer. The second thickness may be larger than the first thickness. The first mold layer may include a plurality of first interconnects coupled to the first package substrate. The second mold layer may include a plurality of second interconnects configured to couple the first package substrate to the printed circuit board.

To more readily understand and put into practical effect, the present device, computing device, method, and other particular aspects will now be described by way of examples and not limitations, and with reference to the figures. For the sake of brevity, duplicate descriptions of features and properties may be omitted.

Figure 1B:
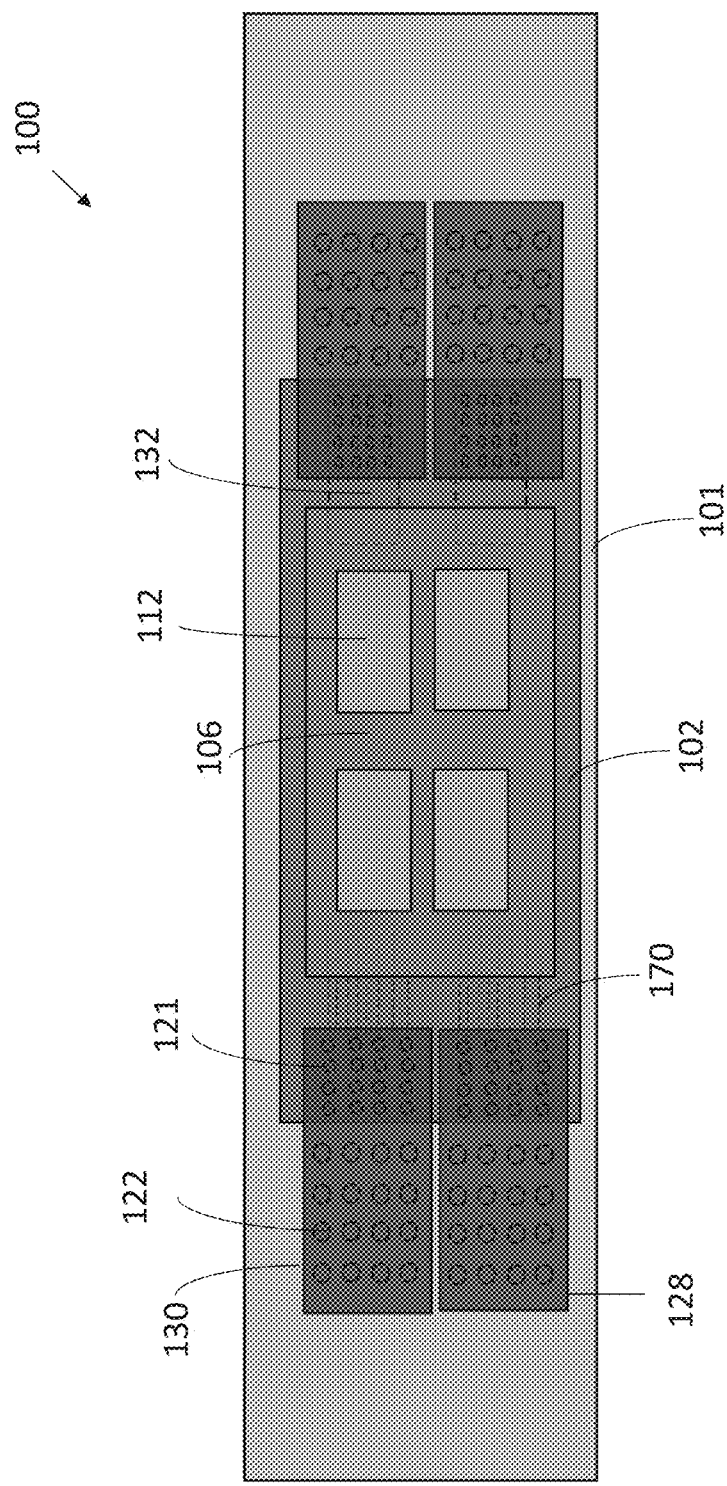
FIG. 1B shows a top view of the semiconductor package according to an aspect of the semiconductor package shown in FIG. 1A.

FIG. 1A shows a cross-sectional view of a semiconductor package according to an aspect of the present disclosure. FIG. 1B shows a top view of the semiconductor package according to an aspect of the semiconductor package shown in FIG. 1A.

In an aspect of the present disclosure, a semiconductor package 100 is shown in FIGS. 1A and 1B. The semiconductor package 100 may be a device. The semiconductor package 100 may be a stacked semiconductor package like a 2.5D or a 3D semiconductor package.

In an aspect of the present disclosure, the semiconductor package 100 may include a first package substrate 128 and/or a second package substrate 102.

In an aspect of the present disclosure, the semiconductor package 100 may include a package substrate 102. The first package substrate 128 and/or the second package substrate 102 may include contact pads, electrical interconnects, routings, and other features, which are not shown in any of the present figures. The first package substrate 128 and/or the second package substrate 102 may have one or more rigid core layers for improved structural stability or a coreless substrate package for a reduced form factor.

In an aspect of the present disclosure, the semiconductor package 100 may include a plurality of solder balls 104. The second package substrate 102 may be connected to a printed circuit board (i.e., a motherboard) 101 through the plurality of solder balls 104. In an aspect, the plurality of solder balls 104 may provide an electrical connection between the second package substrate 102, and the printed circuit board 101.

In an aspect of the present disclosure, the semiconductor package 100 may include an interposer 106. The interposer 106 may be an electrical routing interface between one connection and another. The purpose of the interposer 106 may be to redistribute a connection to a wider pitch or to reroute a connection to a different connection. The interposer 106 may be an active interposer (i.e., comprising one or more transceiver devices) or a passive interposer (i.e., without transceiver devices). The interposer 108 may be a silicon interposer, a ceramic interposer, or an organic interposer.

In an aspect of the present disclosure, the semiconductor package 100 may include a plurality of package bumps 108 disposed on the second package substrate 102. In an aspect, the plurality of package bumps 108 may be controlled collapse chip connection (C4) bumps.

In an aspect of the present disclosure, an underfill layer (not shown) may be deposited to cover, and to protect the plurality of package bumps 108 in a conventional manner. The underfill layer may be provided to enhance the mechanical reliability of the plurality of package bumps 108. The underfill layer may be provided using either a conventional underfilling process or a no-flow underfilling process to reduce the effects of thermal expansion and reduce the stress and strain on the plurality of package bumps 108.

In an aspect of the present disclosure, the interposer 106 may be disposed on the second package substrate 102. In an aspect, the interposer 106 may be connected to the second package substrate 102 through the plurality of package bumps 108. The plurality of package bumps 108 may also provide an electrical connection between the interposer 106, and the second package substrate 102.

In an aspect of the present disclosure, the interposer 106 may include a plurality of through silicon vias (TSVs) 110. In an aspect, the plurality of package bumps 108 may be disposed below the plurality of TSVs 110. In an aspect, the plurality of package bumps 108 may provide an electrical connection between the plurality of TSVs 110, and the second package substrate 102.

In an aspect of the present disclosure, the semiconductor package 100 may include at least one semiconductor die 112. In an aspect, the at least one semiconductor die 112 may be made from any suitable semiconductor, such as silicon or gallium arsenide. As used herein, the term semiconductor die 112 may also cover a chip or a set of chiplets, e.g., a system-on-chip (SOC), a platform controller hub (PCH)/chipset, a memory controller, a field programmable gate array (FPGA) device, a central processing unit (CPU), or a graphic processing unit (GPU).

In an aspect of the present disclosure, the at least one semiconductor die 112 may be disposed on the interposer 106. In an aspect of the present disclosure, a plurality of solder bumps 114 may be disposed on the interposer 106. The plurality of solder bumps 114 may be disposed on an interposer chiplet surface of the interposer 106. The plurality of solder bumps 114 may provide an electrical connection between the plurality of TSVs 110, and the at least one semiconductor die 112. In an aspect, the plurality of TSVs 110 may be configured to facilitate signal transmission and/or power delivery between the second package substrate 102, and the semiconductor die 112.

In an aspect of the present disclosure, the at least one semiconductor die 112 may pass signals and/or power to another semiconductor die 112 through a redistribution layer (RDL) 120 on the interposer 106. In an aspect, the RDL 120 may include a plurality of conductive traces interleaving with a plurality of dielectric layers. In further aspects, the RDL 120 is coupled to the plurality of TSVs 110 within the interposer 106.

In an aspect of the present disclosure, the semiconductor package 100 may include hybrid mold layers. The hybrid mold layers may be at least two mold layers of different thicknesses.

In an aspect of the present disclosure, the semiconductor package 100 may include a first mold layer 116. In an aspect, the first mold layer 116 may be or may include an epoxy polymer resin. A silica filler may be disposed within the first mold layer 116. In an aspect, the first mold layer 116 may have a first thickness. The first thickness may be between 20 µm to 100 µm.

In an aspect of the present disclosure, the semiconductor package 100 may include a second mold layer 118. In an aspect, the second mold layer 118 may have a second thickness. The second thickness may be between 200 µm to 700 µm. In an aspect, the second thickness is larger than the first thickness. In an aspect, the second mold layer 118 may be proximal to the first mold layer 116, for example, adjacent to the first mold layer 116. In an aspect, the first mold layer 116 and the second mold layer 118 may be touching each other, i.e., without a space between them or contiguous. In an aspect, the first mold layer 116 and the second mold layer 118 may form an integral portion.

In another aspect, there may be a space between the first mold layer 116 and the second mold layer 118. An electrical device (e.g., RFIC) may be disposed in the space between the first mold layer 116 and the second mold layer 118.

In an aspect of the present disclosure, the first mold layer 116 may include a plurality of first interconnects 121. The plurality of first interconnects 121 may extend through the first thickness of the first mold layer 116. The plurality of first interconnects 121 may have a first end coupled to the first package substrate 128. The plurality of first interconnects 121 may have a second end coupled to the second package substrate 102.

In an aspect, at least a portion of the first package substrate 128 may overlap the second package substrate 102 to form an overlapped region. In an aspect, the plurality of first interconnects 121 are configured to couple the first package substrate 128 to the second package substrate 102 in the overlapped region. In an aspect, the plurality of first interconnects 121 are configured for direct electrical connection to the second package substrate 102 i.e., a direct electrical connection between the first package substrate 128 and the second package substrate 102 through the plurality of first interconnects 121.

In an aspect of the present disclosure, the second mold layer 118 may include a plurality of second interconnects 122. The plurality of second interconnects 122 may extend through the second thickness of the second mold layer 118. The plurality of second interconnects 122 may have a first end coupled to the first package substrate 128. The plurality of second interconnects 122 may have a second end coupled to the printed circuit board 101. In an aspect, the plurality of second interconnects 122 are configured for direct electrical connection to the printed circuit board 101 i.e., a direct electrical connection between the first package substrate 128 and the printed circuit board 101 through the plurality of second interconnects 122.

In an aspect, the first interconnects 121 and the second interconnects 122 may be heterogeneous or hybrid interconnects.

In an aspect of the present disclosure, each first interconnect of the plurality of first interconnects 121 may have a first diameter and each second interconnect of the plurality of second interconnects 122 may have a second diameter larger than the first diameter. The first diameter may be between 20 μm to 100 μm. The second diameter may be between 200 μm to 500 μm.

In an aspect, the plurality of first interconnects 121 may include metal-plated vias e.g. copper-plated vias, solder-composites vias e.g., tin-silver composites vias or an array of metal pillars and/or pins. Each first interconnect of the plurality of first interconnects 121 may have a pitch geometry ranging in between 30 μm to 200 μm.

In an aspect, the plurality of second interconnects 122 may include metal-plated vias e.g. copper-plated vias, solder-composites vias or an array of metal pillars and/or pins. Each second interconnect of the plurality of second interconnects 122 may have a pitch geometry ranging in between 250 μm to 700 μm.

In an aspect of the present disclosure, the plurality of second interconnects 122 may have an electrical property e.g., metal conductivity, that may be different from the plurality of first interconnects 121.

In an aspect of the present disclosure, the plurality of first interconnects 121 may be configured to facilitate signal transmission between the second package substrate 102 and the first package substrate 128. For example, the plurality of first interconnects 121 may be configured to facilitate data signal transmissions such as electrical signal transmissions of double data-rate (DDR) memory (at 6.4 GT/s and/or beyond) and/or radio frequency (RF) signals (at 77 GHz and/or beyond).

In an aspect, the plurality of second interconnects 122 may be configured to facilitate power delivery and/or reference voltage from the printed circuit board 101 to the first package substrate 128. For example, the plurality of second interconnects 122 may be configured to facilitate power delivery e.g., a power supply voltage (Vcc) and to facilitate reference voltage connection e.g., a ground reference voltage (Vss) for a signal current return path.

In an aspect of the present disclosure, a plurality of first solder bumps 124 may be disposed below the plurality of first interconnects 121. In an aspect, the plurality of first solder bumps 124 may provide an electrical connection between the plurality of first interconnects 121, and the second package substrate 102.

In an aspect of the present disclosure, a plurality of second solder bumps 126 may be disposed below the plurality of second interconnects 122. In an aspect, the plurality of second solder bumps 126 may provide an electrical connection between the plurality of second interconnects 122, and the printed circuit board 101.

In an aspect of the present disclosure, each first solder bump of the plurality of first solder bumps 124 has a first diameter and each second solder bump of the plurality of second solder bumps 126 has a second diameter larger than the first diameter. In an aspect, the plurality of solder balls 104 has a third diameter equivalent to the second diameter.

In an aspect of the present disclosure, at least one memory device 130 may be coupled to the first package substrate 128. The at least one memory device 130 may be a DRAM. In an aspect, at least one memory device 130 may be coupled to the first interconnects 121 and the second interconnects 122 through a plurality of metal routing layers and vias.

In an aspect, the first package substrate 128, the first mold layer 116, the second mold layer 118 and the memory device 130 together form a first memory platform 150, which is located at a first end of the second substrate 102 as shown in FIG. 1A. In another aspect, a second memory platform 160, which a mirror image of the first memory platform 150 is located at a second end of the second substrate 102 opposite the first end of the second substrate 102 and the interposer 106 may be positioned between the first memory platform 150 and the second memory platform 160.

In an aspect of the present disclosure, the at least one memory device 130 and/or the first package substrate 128 may communicate with the second package substrate 102 and/or at least one semiconductor die 112 through one or more routing traces 170 or embedded bridge 132 to facilitate higher interconnect density. In an aspect, the embedded bridges 132 or routing traces 170 may be in the second package substrate 102. The plurality of first interconnects 121 may be electrically coupled to the embedded bridge 132 or the routing traces 170. In an aspect, the first mold layer 116 may extend across a portion of the one or more embedded bridges 132.

Figure 2:
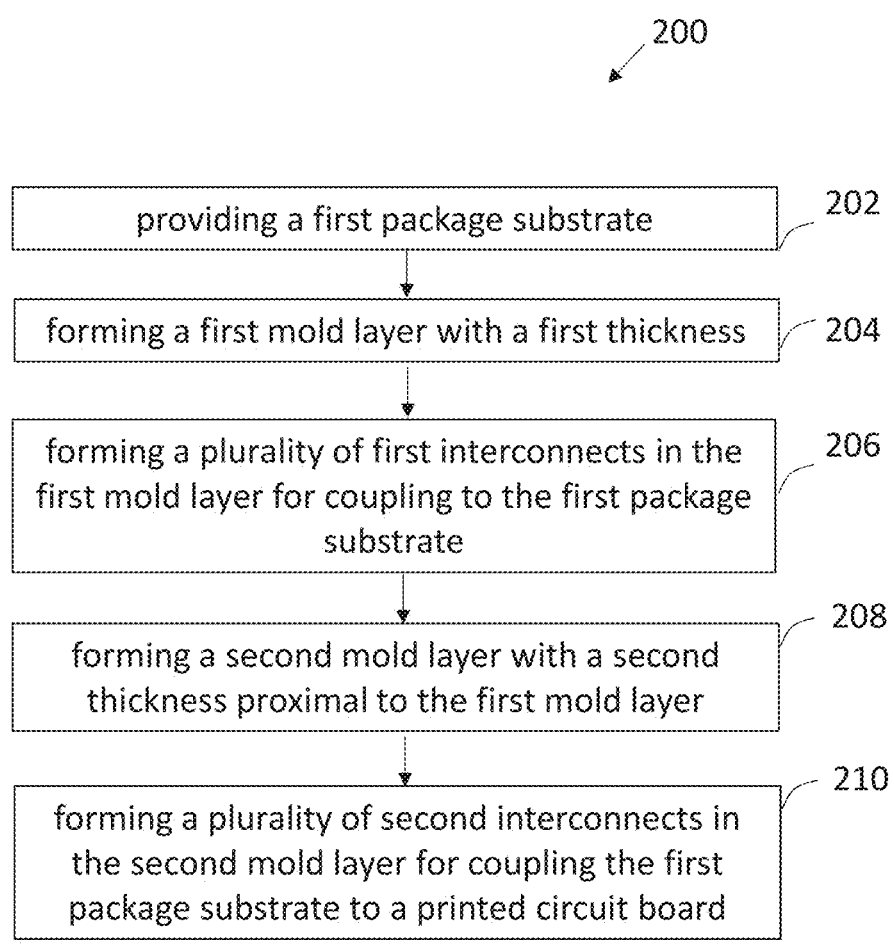
FIG. 2 shows a flow chart illustrating a method of forming a semiconductor package according to an aspect of the present disclosure.

FIG. 2 shows a flow chart illustrating a method of forming a semiconductor package according to an aspect of the present disclosure.

As shown in FIG. 2, there may be a method 200 of forming a device. In the method 200, a first operation 202 may include providing a first package substrate. A second operation 204 may include forming a first mold layer with a first thickness. A third operation 206 may include forming a plurality of first interconnects in the first mold layer for coupling to the first package substrate. A fourth operation 208 may include forming a second mold layer with a second thickness proximal to the first mold layer. The second thickness may be larger than the first thickness. A fifth operation 210 may include forming a plurality of second interconnects in the second mold layer for coupling the first package substrate to a printed circuit board.

It will be understood that the above operations described above relating to FIG. 2 are not limited to this particular order. Any suitable, modified order of operations may be used.

Figure 3:
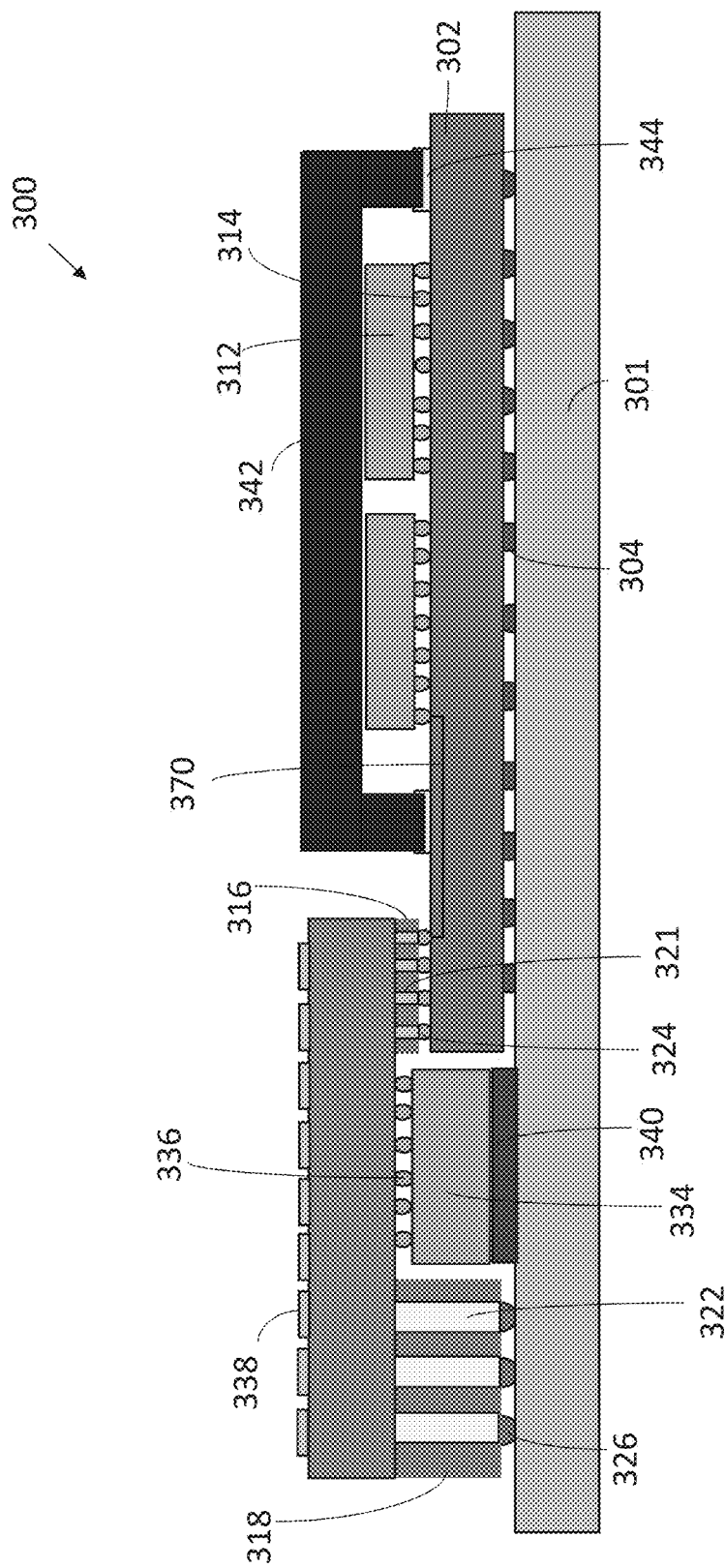
FIG. 3 shows a cross-sectional view of a semiconductor package according to an aspect of the present disclosure.

FIG. 3 shows a cross-sectional view of a semiconductor package according to an aspect of the present disclosure.

In an aspect of the present disclosure, a semiconductor package 300 is shown in FIG. 3. The semiconductor package 300 may be a device. The semiconductor package 300 may be a stacked semiconductor package like a 2.5D or a 3D semiconductor package.

In an aspect of the present disclosure, the semiconductor package 300 may include a first package substrate 328 and/or a second package substrate 302.

In an aspect of the present disclosure, the semiconductor package 300 may include a package substrate 302. The first package substrate 328 and/or the second package substrate 302 may include contact pads, electrical interconnects, routings, and other features, which are not shown in any of the present figures. The first package substrate 328 and/or the second package substrate 302 may have one or more rigid core layers for improved structural stability or a coreless substrate package for a reduced form-factor. In other aspects, the first package substrate 328 and/or the second package substrate 302 may be part of a larger substrate that supports additional semiconductor packages, and/or components.

In an aspect of the present disclosure, the semiconductor package 300 may include a plurality of solder balls 304. The second package substrate 302 may be connected to a printed circuit board (i.e., a motherboard) 301 through the plurality of solder balls 304. In an aspect, the plurality of solder balls 304 may provide an electrical connection between the second package substrate 302, and the printed circuit board.

In an aspect of the present disclosure, the semiconductor package 300 may include at least one semiconductor die 312. In an aspect, the at least one semiconductor die 312 may be made from any suitable semiconductor, such as silicon or gallium arsenide. As used herein, the term semiconductor die 312 may also cover a chip or a set of chiplets, e.g., a system-on-chip (SOC), a platform controller hub (PCH)/chipset, a memory device, a field programmable gate array (FPGA) device, a central processing unit (CPU), or a graphic processing unit (GPU).

In an aspect of the present disclosure, the at least one semiconductor die 312 may be disposed on the second package substrate 302. In an aspect, a plurality of solder bumps 314 may be disposed on the second package substrate 302. The plurality of solder bumps 314 may be disposed on a surface of the second package substrate 302. The plurality of solder bumps 314 may provide an electrical connection between the second package substrate 302, and the at least one semiconductor die 312. In an aspect, the plurality of solder bumps 314 may be configured to facilitate signal transmission and/or power delivery between the second package substrate 302, and the semiconductor die 312.

In an aspect of the present disclosure, the semiconductor package 300 may include hybrid mold layers. The hybrid mold layers may be at least two mold layers of different thicknesses.

In an aspect of the present disclosure, the semiconductor package 300 may include a first mold layer 316. In an aspect, the first mold layer 316 may be or may include an epoxy polymer resin. A silica filler may be disposed within the first mold layer 316. In an aspect, the first mold layer 316 may have a first thickness. The first thickness may be between 20 µm to 100 µm.

In an aspect of the present disclosure, the semiconductor package 300 may include a second mold layer 318. In an aspect, the second mold layer 318 may have a second thickness. The second thickness may be between 200 µm to 700 µm. In an aspect, the second thickness is larger than the first thickness. In an aspect, the second mold layer 318 may be proximal to the first mold layer 316. In another aspect, there may be a space between the first mold layer 316 and the second mold layer 318.

In an aspect, an electrical device 334 (e.g., a silicon device such as a RFIC) may be disposed in the space between the first mold layer 316 and the second mold layer 318. In an aspect, the electrical device 334 is electrically coupled on a first side to the first package substrate 328 and coupled on a second side to a heat spreader 340. The heat spreader 340 may be disposed on the printed circuit board 301. The heat spreader 340 may be a heat slug.

In an aspect, a plurality of electrical bumps 336 may be disposed on the first side of the electrical device 334. The plurality of electrical bumps 336 may provide a connection between the first package substrate 328, and the electrical device 334.

In an aspect, a plurality of antennas 338 (e.g., phase array antennas (PAAs)) may be disposed on the first package substrate 328. In an aspect, the plurality of antennas 338 may be for facilitating RF signal transmission and reception.

In an aspect, reduced signal latency and electrical losses between RFIC and the at least one semiconductor die 312 e.g., a central processing unit (CPU) or a system-on-chip (SOC) may be achieved through the first interconnects 321. Improved channel impedance matching may be achieved through reduced interconnect geometry and undesired routing transitions.

In an aspect of the present disclosure, the first mold layer 316 may include a plurality of first interconnects 321. The plurality of first interconnects 321 may extend through the first thickness of the first mold layer 316. The plurality of first interconnects 321 may have a first end coupled to the first package substrate 328. The plurality of first interconnects 321 may have a second end coupled to the second package substrate 302.

In an aspect, at least a portion of the first package substrate 328 may overlap the second package substrate 302 to form an overlapped region. The first mold layer 316 may be positioned between the first package substrate 328 and second package substrate 302 in the overlapped region. In an aspect, the plurality of first interconnects 321 are configured to couple the first package substrate 328 to the second package substrate 302 in the overlapped region. In an aspect, the plurality of first interconnects 321 may be configured for direct electrical connection to the second package substrate 302 i.e., a direct electrical connection between the first package substrate 328 and the second package substrate 302 through the plurality of first interconnects 321.

In an aspect of the present disclosure, the second mold layer 318 may include a plurality of second interconnects 322. The plurality of second interconnects 322 may extend through the second thickness of the second mold layer 318. The plurality of second interconnects 322 may have a first end coupled to the first package substrate 328. The plurality of second interconnects 322 may have a second end coupled to the printed circuit board 301. In an aspect, the second mold layer 318 may be positioned between the first package substrate 328 and the printed circuit board 301. In an aspect, the plurality of second interconnects 322 are configured for direct electrical connection to the printed circuit board 301 i.e., a direct electrical connection between the first package substrate 328 and the printed circuit board 301 through the plurality of second interconnects 322.

In an aspect, the first interconnects 321 and the second interconnects 322 may be heterogeneous or hybrid interconnects.

In an aspect of the present disclosure, each first interconnect of the plurality of first interconnects 321 may have a first diameter and each second interconnect of the plurality of second interconnects 322 may have a second diameter larger than the first diameter. The first diameter may be between 20 μm to 100 μm. The second diameter may be between 200 μm to 500 μm.

In an aspect, the plurality of first interconnects 321 may include metal-plated vias e.g. copper-plated vias, solder-composites vias e.g., tin-silver composites vias or an array of metal pillars and/or pins. Each first interconnect of the plurality of first interconnects 321 may have a pitch geometry ranging in between 30 μm to 200 μm.

In an aspect, the plurality of second interconnects 322 may include metal-plated vias e.g. copper-plated vias, solder-composites vias or an array of metal pillars and/or pins. Each second interconnect of the plurality of second interconnects 322 may have a pitch geometry ranging in between 250 μm to 700 μm.

In an aspect of the present disclosure, the plurality of second interconnects 322 may have an electrical property e.g., metal conductivity, that may be different from the plurality of first interconnects 321.

In an aspect of the present disclosure, the plurality of first interconnects 321 may be configured to facilitate signal transmission between the second package substrate 302 and the first package substrate 328. For example, the plurality of first interconnects 321 may be configured to facilitate data signal transmissions such as electrical signal transmissions of double data-rate (DDR) memory (at 6.4 GT/s and/or beyond) and/or radio frequency (RF) signals (at 77 GHz and/or beyond).

In an aspect, the plurality of second interconnects 322 may be configured to facilitate power delivery from the printed circuit board 301 to the first package substrate 328. For example, the plurality of second interconnects 322 may be configured to facilitate power delivery e.g., a power supply voltage (Vcc) and to facilitate reference voltage connection e.g., a ground reference voltage (Vss) for a signal current return path.

In an aspect of the present disclosure, a plurality of first solder bumps 324 may be disposed below the plurality of first interconnects 321. In an aspect, the plurality of first solder bumps 324 may provide an electrical connection between the plurality of first interconnects 321, and the second package substrate 302.

In an aspect of the present disclosure, a plurality of second solder bumps 326 may be disposed below the plurality of second interconnects 322. In an aspect, the plurality of second solder bumps 326 may provide an electrical connection between the plurality of second interconnects 322, and the printed circuit board 301.

In an aspect of the present disclosure, each first solder bump of the plurality of first solder bumps 324 has a first diameter and each second solder bump of the plurality of second solder bumps 326 has a second diameter larger than the first diameter. In an aspect, the plurality of solder balls 304 has a third diameter equivalent to the second diameter.

In an aspect of the present disclosure, the first package substrate 328 may communicate with the second package substrate 302 and/or at least one semiconductor die 312 through one or more routing traces 370 or embedded bridge (not shown) to facilitate higher interconnect density. In an aspect, the one or more routing traces 370 or embedded bridge may be in the second package substrate 302. The plurality of first interconnects 321 may be electrically coupled to the one or more routing traces 370 or embedded bridge. In an aspect, the first mold layer 316 may extend across a portion of the one or more routing traces 370 or embedded bridges (similar to FIG. 1B).

In an aspect of the present disclosure, a metal shield 342 may be disposed on the second package substrate 302. The metal shield 342 may be a heat sink, a heat spreader, or a conductive casing. The metal shield 342 may be coupled to the second package substrate 302 through adhesive 344. In an aspect, the metal shield 342 may be disposed over the at least one semiconductor die 312. The metal shield 342 may be configured for thermal dissipation and/or electrical shielding of the at least one semiconductor die 312, for example, from the electrical device 334 and/or the plurality of antennas 338.

FIGS. 4A through 4I show cross-sectional views directed to an exemplary process flow for a method of forming a semiconductor package according to an aspect of the present disclosure.

Figure 4A:
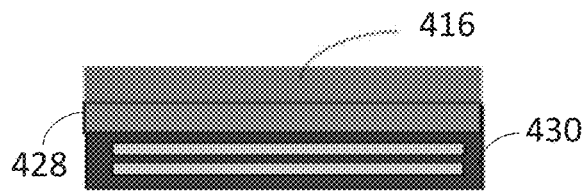
FIGS. 4A through 4I show cross-sectional views directed to an exemplary process flow for a method of forming a semiconductor package according to an aspect of the present disclosure.

As shown in FIG. 4A, a memory device 430 may be disposed on a first package substrate 428. A first mold layer 416 may be formed on the first package substrate 428 through a compression (i.e., thermal compression), injection and/or a transfer molding process.

Figure 4B:
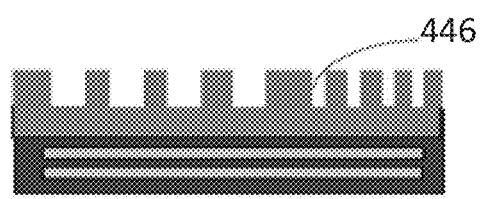

As shown in FIG. 4B, a plurality of first interconnect openings 446 may be formed in the first mold layer 416 using mechanical drilling, laser drilling, milling and/or etching process.

Figure 4C:
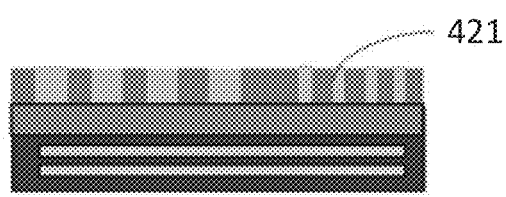

As shown in FIG. 4C, a plurality of first interconnects 421 may be formed in the plurality of first interconnect openings 446 using an electroplating process, a solder paste printing and/or a coating process.

Figure 4D:
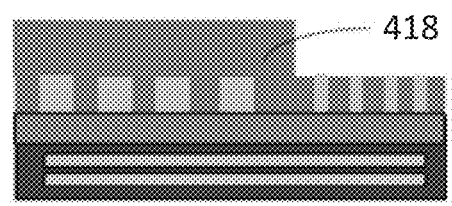

As shown in FIG. 4D, a second mold layer 418 may be formed on the first mold layer 416 through a compression (i.e., thermal compression), injection and/or a transfer molding process. In an aspect, the second mold layer 418 may include an electrical property e.g., a dielectric constant, or a dielectric loss tangent etc. equivalent to the first mold layer 416. In other aspect, the second mold layer 418 may include an electrical property e.g., a dielectric constant, or a dielectric loss tangent etc different than the first mold layer 416.

Figure 4E:
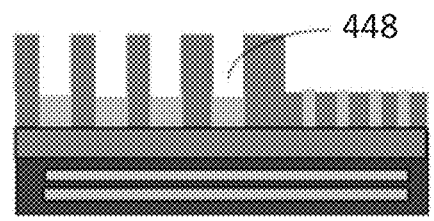

As shown in FIG. 4E, a plurality of second interconnect openings 448 may be formed in the second mold layer 418 using mechanical drilling, laser drilling, milling and/or etching process.

Figure 4F:
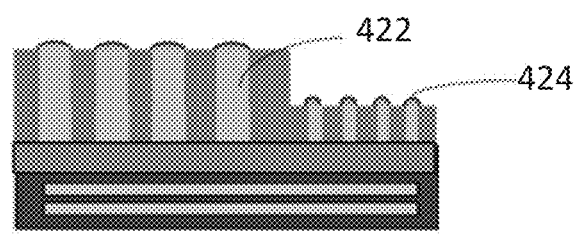

As shown in FIG. 4F, a plurality of second interconnects 422 may be formed in the plurality of second interconnect openings 448 using an electroplating process, a solder paste printing and/or a coating process. A plurality of first solder bumps 424 may be formed on the plurality of first interconnects 421 using surface solder plating.

Figure 4G:
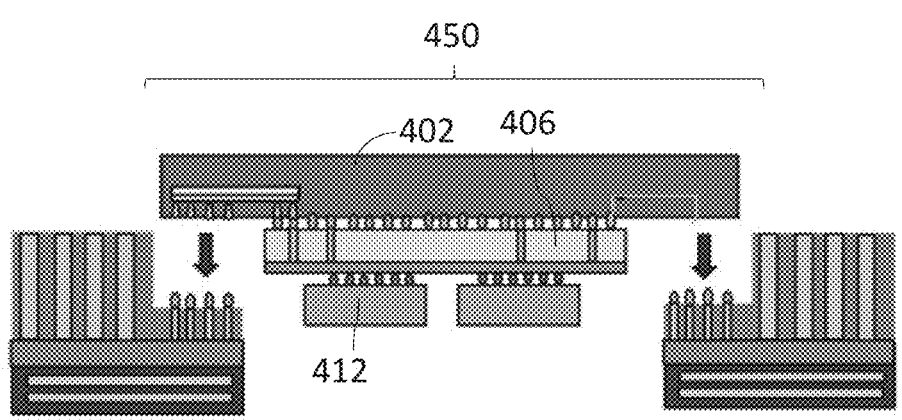

As shown in FIG. 4G, a prefabricated structure 450 including a second package substrate 402, an interposer 406, and at least one semiconductor die 412 may be attached to the structure of FIG. 4F through a surface mounting and/or solder reflow process.

Figure 4H:
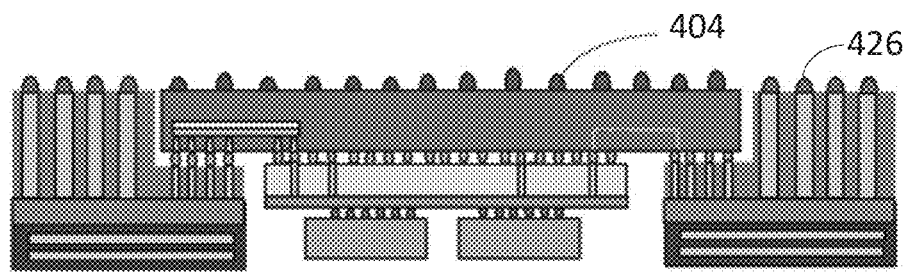

As shown in FIG. 4H, a plurality of second solder bumps 426 may be formed on the plurality of second interconnects 422 using surface mounting and/or solder reflow process. A plurality of solder balls 404 may be formed on the second package substrate 402 using surface mounting and/or solder reflow process.

Figure 4I:
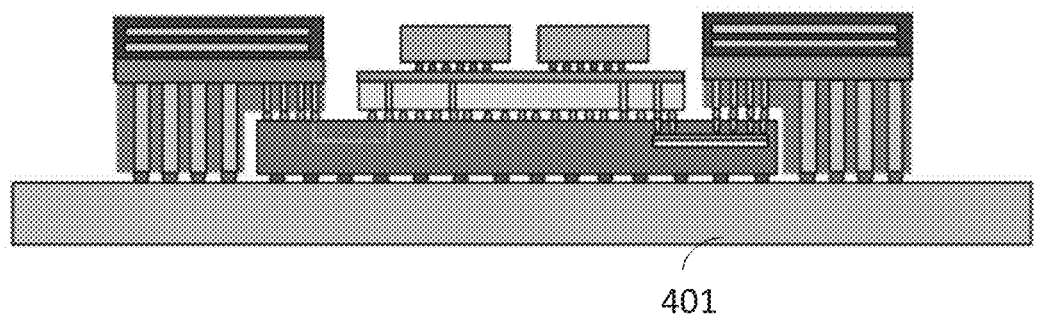

As shown in FIG. 4I, the flipped structure of FIG. 4H may be attached to a printed circuit board 401 through a surface mounting and/or solder reflow process.

It will be understood that the exemplary process described above relating to FIGS. 4A through 4I are not limited to this particular order. Any suitable, modified order of operations may be used.

Aspects of the present disclosure may be implemented into a system using any suitable hardware and/or software.

Figure 5:
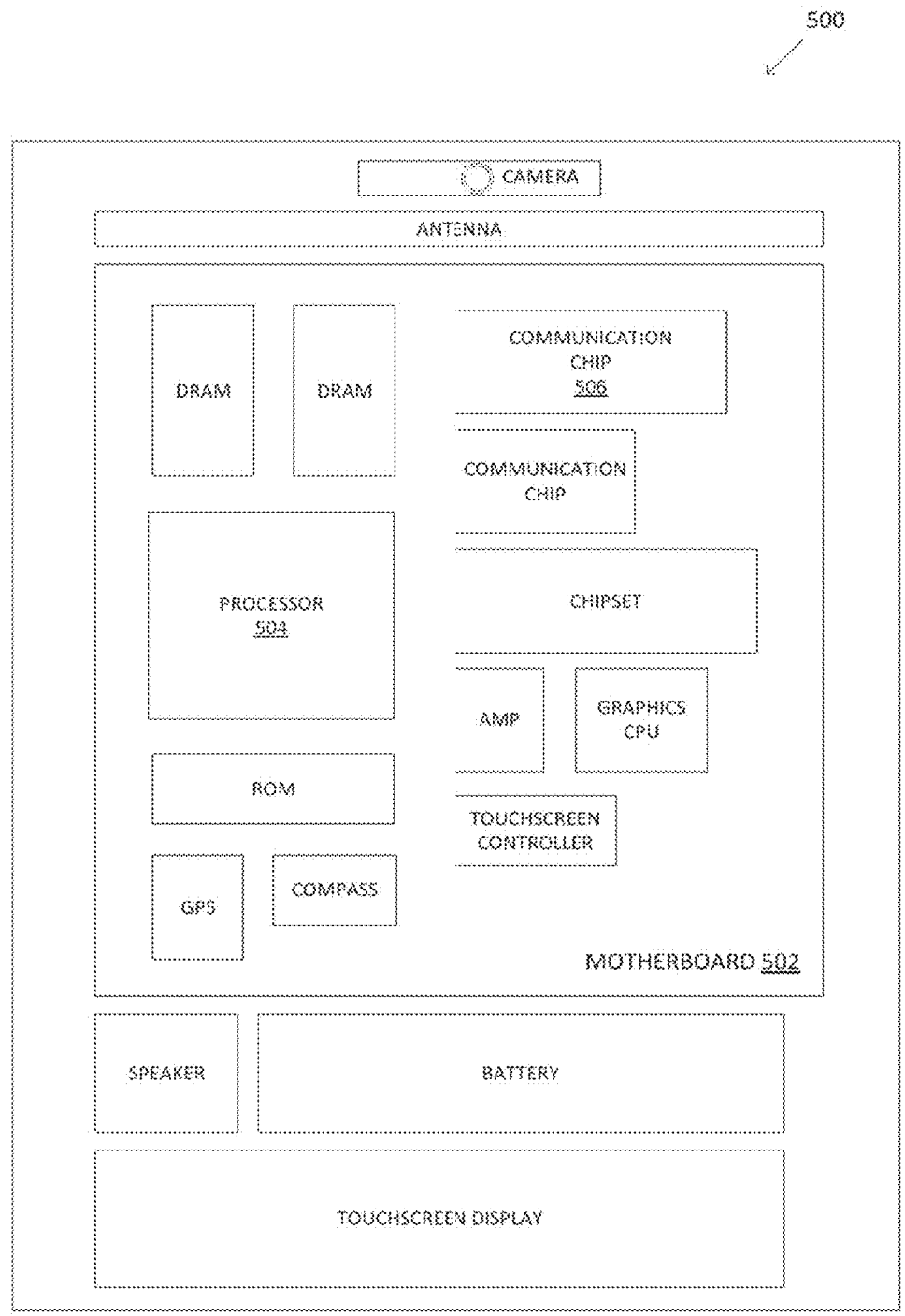
FIG. 5 schematically illustrates a computing device 500 that may include a semiconductor package as described herein, in accordance with some aspects.

FIG. 5 schematically illustrates a computing device 500 that may include a semiconductor package as described herein, in accordance with some aspects.

As shown in FIG. 5, the computing device 500 may house a board such as a motherboard 502. The motherboard 502 may include a number of components, including but not limited to a processor 504 and at least one communication chip 506. The processor 504 may be physically and electrically coupled to the motherboard 502. In some implementations, the at least one communication chip 506 may also be physically and electrically coupled to the motherboard 502. In further implementations, the communication chip 506 may be part of the processor 504.

Depending on its applications, computing device 500 may include other components that may or may not be physically and electrically coupled to the motherboard 502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth). In another aspect, the processor 504 of the computing device 500 may be packaged in a semiconductor package, as described herein, and/or other semiconductor devices may be packaged together in a semiconductor package as described herein.

The communication chip 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some aspects they might not. The communication chip 506 may implement any of a number of wireless standards or protocols, including but not limited to Institute for Electrical and Electronics Engineers (IEEE) standards including Wi-Fi (IEEE 502.11 family), IEEE 502.16 standards (e.g., IEEE 502.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 502.16 compatible BWA networks are generally referred to as WiMAX networks, an acronym that stands for Worldwide Interoperability for Microwave Access, which is a certification mark for products that pass conformity and interoperability tests for the IEEE 502.16 standards.

The communication chip 506 may also operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 506 may operate in accordance with other wireless protocols in other aspects.

The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In an aspect, the computing device 500 may be a mobile computing device. In further implementations, the computing device 500 may be any other electronic device that processes data.

EXAMPLES

Example 1 may include a device including a first package substrate. The device may include a first mold layer with a first thickness. The device may include a second mold layer with a second thickness proximal to the first mold layer. The second thickness may be larger than the first thickness. The first mold layer may include a plurality of first interconnects coupled to the first package substrate. The second mold layer may include a plurality of second interconnects configured to couple the first package substrate to a printed circuit board.

Example 2 may include the device of example 1 and/or any other example disclosed herein in which the device further includes a second package substrate, wherein at least a portion of the first package substrate overlaps the second package substrate to form an overlapped region, and wherein the plurality of first interconnects are configured to couple the first package substrate to the second package substrate in the overlapped region.

Example 3 may include the device of example 2 and/or any other example disclosed herein in which the first mold layer is positioned between the first package substrate and second package substrate in the overlapped region, and the plurality of first interconnects are configured for direct electrical connection to the second package substrate, in which the second mold layer is positioned between the first package substrate and the printed circuit board, and the plurality of second interconnects are configured for direct electrical connection to the printed circuit board.

Example 4 may include the device of example 1 and/or any other example disclosed herein in which each first interconnect of the plurality of first interconnects has a first diameter and each second interconnect of the plurality of second interconnects has a second diameter larger than the first diameter.

Example 5 may include the device of example 2 and/or any other example disclosed herein in which the plurality of first interconnects are configured to facilitate signal transmission between the second package substrate and the first package substrate, and in which the plurality of second interconnects are configured to facilitate power delivery from the printed circuit board to the first package substrate.

Example 6 may include the device of example 1 and/or any other example disclosed herein in which the device further includes a space between the first mold layer and the second mold layer, in which the device further includes an electrical device disposed in the space, in which the electrical device is electrically coupled on a first side to the first package substrate and coupled on a second side to a heat spreader disposed on the printed circuit board.

Example 7 may include the device of example 6 and/or any other example disclosed herein in which the electrical device is a radio-frequency integrated circuit (RFIC), and in which the device further includes a plurality of antennas disposed on the first package substrate configured for signal connection with the RFIC.

Example 8 may include the device of example 6 and/or any other example disclosed herein in which the device further includes at least one semiconductor die disposed on the second package substrate, and in which the device further includes a metal shield disposed over the at least one semiconductor die configured for thermal dissipation and/or electrical shielding of the at least one semiconductor die from the electrical device.

Example 9 may include the device of example 3 and/or any other example disclosed herein in which the device further includes a first memory platform comprising at least one memory device coupled to a top surface of the first package substrate and the first mold layer and second mold layer attached to a bottom surface of the first package substrate located at a first end of the second substrate, and a second memory platform located at a second end of the second substrate opposite the first end of the second substrate.

Example 10 may include a method including providing a first package substrate, forming a first mold layer with a first thickness, forming a plurality of first interconnects in the first mold layer for coupling to the first package substrate, forming a second mold layer with a second thickness proximal to the first mold layer, wherein the second thickness may be larger than the first thickness, and forming a plurality of second interconnects in the second mold layer for coupling the first package substrate to a printed circuit board.

Example 11 may include the method of example 10 and/or any other example disclosed herein in which the method further includes providing a second package substrate, wherein at least a portion of the first package substrate overlaps the second package substrate to form an overlapped region, and wherein the plurality of first interconnects are configured to couple the first package substrate to the second package substrate in the overlapped region.

Example 12 may include the method of example 11 and/or any other example disclosed herein in which the first mold layer is positioned between the first package substrate and second package substrate in the overlapped region, and the plurality of first interconnects are configured for direct electrical connection to the second package substrate, in which the second mold layer is positioned between the first package substrate and the printed circuit board, and the plurality of second interconnects are configured for direct electrical connection to the printed circuit board.

Example 13 may include the method of example 11 and/or any other example disclosed herein in which each first interconnect of the plurality of first interconnects has a first diameter and each second interconnect of the plurality of second interconnects has a second diameter larger than the first diameter.

Example 14 may include the method of example 11 and/or any other example disclosed herein in which the plurality of first interconnects are configured to facilitate signal transmission between the second package substrate and the first package substrate, and wherein the plurality of second interconnects are configured to facilitate power delivery from the printed circuit board to the first package substrate.

Example 15 may include the method of example 10 and/or any other example disclosed herein in which the method further includes forming a space between the first mold layer and the second mold layer, disposing an electrical device in the space, wherein the electrical device is electrically coupled on a first side to the first package substrate and coupled on a second side to a heat spreader disposed on the printed circuit board.

Example 16 may include the method of example 15 and/or any other example disclosed herein in which the method further includes disposing a plurality of antennas disposed on the first package substrate, wherein the electrical device is a radio-frequency integrated circuit (RFIC) and the plurality of antennas are configured for signal connection with the RFIC.

Example 17 may include the method of example 15 and/or any other example disclosed herein in which the method further includes disposing at least one semiconductor die on the second package substrate, and disposing a metal shield over the at least one semiconductor die for thermal dissipation and/or electrical shielding of the at least one semiconductor die from the electrical device.

Example 18 may include the method of example 10 and/or any other example disclosed herein in which the method further includes coupling at least one memory device to the first package substrate.

Example 19 may include a computing device including a printed circuit board, and a device coupled to the printed circuit board. The device may include a first mold layer with a first thickness. The device may include a second mold layer with a second thickness proximal to the first mold layer. The second thickness may be larger than the first thickness. The first mold layer may include a plurality of first interconnects coupled to the first package substrate. The second mold layer may include a plurality of second interconnects configured to couple the first package substrate to the printed circuit board.

Example 20 may include the computing device of example 19 and/or any other example disclosed herein in which the computing device further includes a second package substrate, wherein at least a portion of the first package substrate overlaps the second package substrate to form an overlapped region, and wherein the plurality of first interconnects are configured to couple the first package substrate to the second package substrate in the overlapped region.

These and other advantages and features of the aspects herein disclosed will be apparent through reference to the following description and the accompanying drawings. Furthermore, it is to be understood that the features of the various aspects described herein are not mutually exclusive and can exist in various combinations and permutations.

It will be understood that any property described herein for a specific package or device may also hold for any package or device described herein. It will also be understood that any property described herein for a specific method may hold for any of the methods described herein. Furthermore, it will be understood that for any device, package, or method described herein, not necessarily all the components or operations described will be enclosed in the device, package, or method, but only some (but not all) components or operations may be enclosed.

The term "comprising" shall be understood to have a broad meaning similar to the term "including" and will be understood to imply the inclusion of a stated integer or operation or group of integers or operations but not the exclusion of any other integer or operation or group of integers or operations. This definition also applies to variations on the term "comprising" such as "comprise" and "comprises".

The term "coupled" (or "connected") herein may be understood as electrically coupled or as mechanically coupled, e.g., attached or fixed or attached, or just in contact without any fixation, and it will be understood that both direct coupling or indirect coupling (in other words: coupling without direct contact) may be provided.

While the present disclosure has been particularly shown and described with reference to specific aspects, it should be understood by those skilled in the art that various changes in form and detail may be made therein without departing from the scope of the present disclosure as defined by the appended claims. The scope of the present disclosure is thus indicated by the appended claims and all changes which come within the meaning and range of equivalency of the claims are therefore intended to be embraced.

What is claimed is:

1. A device comprising:
   a first package substrate;
   a first mold layer with a first thickness;
   a second mold layer with a second thickness proximal to the first mold layer, wherein the second thickness is larger than the first thickness;
   wherein the first mold layer comprises a plurality of first interconnects coupled to the first package substrate; and
   wherein the second mold layer comprises a plurality of second interconnects configured to couple the first package substrate to a printed circuit board,
   wherein the device further comprises:
   a space between the first mold layer and the second mold layer; and
   an electrical device disposed in the space, wherein the electrical device is electrically coupled on a first side to the first package substrate and coupled on a second side to a heat spreader disposed on the printed circuit board.

2. The device of claim 1, further comprising:
   a second package substrate;
   wherein at least a portion of the first package substrate overlaps the second package substrate to form an overlapped region; and
   wherein the plurality of first interconnects are configured to couple the first package substrate to the second package substrate in the overlapped region.

3. The device of claim 2,
   wherein the first mold layer is positioned between the first package substrate and second package substrate in the overlapped region, and the plurality of first interconnects are configured for direct electrical connection to the second package substrate;
   wherein the second mold layer is positioned between the first package substrate and the printed circuit board, and the plurality of second interconnects are configured for direct electrical connection to the printed circuit board.

4. The device of claim 3, further comprising:
   a first memory platform comprising at least one memory device coupled to a top surface of the first package substrate, wherein the first mold layer and the second mold layer are attached to a bottom surface of the first package substrate located at a first end of the second package substrate; and
   a second memory platform located at a second end of the second substrate opposite the first end of the second package substrate.

5. The device of claim 2,
   wherein the plurality of first interconnects are configured to facilitate signal transmission between the second package substrate and the first package substrate; and
   wherein the plurality of second interconnects are configured to facilitate power delivery from the printed circuit board to the first package substrate.

6. The device of claim 1,
   wherein each first interconnect of the plurality of first interconnects has a first diameter and each second interconnect of the plurality of second interconnects has a second diameter larger than the first diameter.

7. The device of claim 1,
   wherein the electrical device is a radio-frequency integrated circuit (RFIC); and
   wherein the device further comprises a plurality of antennas disposed on the first package substrate configured for signal connection with the RFIC.

8. The device of claim 1, further comprising:
   at least one semiconductor die disposed on the second package substrate; and
   a metal shield disposed over the at least one semiconductor die configured for thermal dissipation and/or electrical shielding of the at least one semiconductor die from the electrical device.

9. A method comprising:
   providing a first package substrate;
   forming a first mold layer with a first thickness;
   forming a plurality of first interconnects in the first mold layer for coupling to the first package substrate;
   forming a second mold layer with a second thickness proximal to the first mold layer, wherein the second thickness is larger than the first thickness; and
   forming a plurality of second interconnects in the second mold layer for coupling the first package substrate to a printed circuit board,
   forming a space between the first mold layer and the second mold layer;
   disposing an electrical device in the space, wherein the electrical device is electrically coupled on a first side to the first package substrate and coupled on a second side to a heat spreader disposed on the printed circuit board.

10. The method of claim 9, further comprising:
providing a second package substrate, wherein at least a portion of the first package substrate overlaps the second package substrate to form an overlapped region; and
wherein the plurality of first interconnects are configured to couple the first package substrate to the second package substrate in the overlapped region.

11. The method of claim 10,
wherein the first mold layer is positioned between the first package substrate and second package substrate in the overlap region and the plurality of first interconnects are configured for direct electrical connection to the second package substrate;
wherein the second mold layer is positioned between the first package substrate and the printed circuit board, and the plurality of second interconnects are configured for direct electrical connection to the printed circuit board.

12. The method of claim 10, wherein each first interconnect of the plurality of first interconnects has a first diameter and each second interconnect of the plurality of second interconnects has a second diameter larger than the first diameter.

13. The method of claim 10,
wherein the plurality of first interconnects are configured to facilitate signal transmission between the second package substrate and the first package substrate; and
wherein the plurality of second interconnects are configured to facilitate power delivery from the printed circuit board to the first package substrate.

14. The method of claim 9, further comprising:
disposing a plurality of antennas disposed on the first package substrate;
wherein the electrical device is a radio-frequency integrated circuit (RFIC) and the plurality of antennas are configured for signal connection with the RFIC.

15. The method of claim 9, further comprising:
disposing at least one semiconductor die on the second package substrate; and
disposing a metal shield over the at least one semiconductor die for thermal dissipation and/or electrical shielding of the at least one semiconductor die from the electrical device.

16. The method of claim 9, further comprising:
coupling at least one memory device to the first package substrate.

17. A computing device comprising:
a printed circuit board; and
a device coupled to the printed circuit board comprising:
a first package substrate;
a first mold layer with a first thickness;
a second mold layer with a second thickness proximal to the first mold layer;
wherein the first mold layer comprises a plurality of first interconnects coupled to the first package substrate; and
wherein the second mold layer comprises a plurality of second interconnects configured to couple the first package substrate to the printed circuit board,
wherein the first mold layer and the second mold layer are directly attached to a bottom surface of the first package substrate.

18. The computing device of claim 17, further comprising:
a second package substrate;
wherein at least a portion of the first package substrate overlaps the second package substrate to form an overlapped region; and
wherein the plurality of first interconnects are configured to couple the first package substrate to the second package substrate in the overlapped region.

19. The computing device of claim 18,
wherein the first mold layer is positioned between the first package substrate and second package substrate in the overlapped region, and the plurality of first interconnects are configured for direct electrical connection to the second package substrate;
wherein the second mold layer is positioned between the first package substrate and the printed circuit board, and the plurality of second interconnects are configured for direct electrical connection to the printed circuit board,
wherein the device further comprises:
a first memory platform comprising at least one memory device coupled to a top surface of the first package substrate, wherein the first mold layer and the second mold layer are attached to a bottom surface of the first package substrate located at a first end of the second package substrate; and
a second memory platform located at a second end of the second substrate opposite the first end of the second package substrate.

20. The computing device of claim 17, further comprising:
a further device disposed on a top surface of the first package substrate, the top surface opposite to the bottom surface,
wherein the further device comprises a plurality of antennas or a memory device.

* * * * *